United States Patent [19]
Kepler et al.

[11] Patent Number: 5,276,685
[45] Date of Patent: Jan. 4, 1994

[54] DIGITAL AUTOMATIC GAIN CONTROL

[75] Inventors: James F. M. Kepler, Northbrook; David E. Borth, Palatine; Frank J. Cerny, Jr., North Riverside, all of Ill.

[73] Assignee: Motorola, Inc., Schaumburg, Ill.

[21] Appl. No.: 875,577

[22] Filed: Apr. 27, 1992

Related U.S. Application Data

[63] Continuation of Ser. No. 652,381, Jan. 28, 1991, abandoned, which is a continuation of Ser. No. 278,051, Nov. 30, 1988, abandoned.

[51] Int. Cl.$^5$ .............................................. H04J 3/16
[52] U.S. Cl. ........................... 370/95.3; 455/234.1; 375/98
[58] Field of Search ................. 370/95.3, 104.1, 77; 375/98; 455/250.1, 234.1, 33.1; 330/278, 279

[56] References Cited

U.S. PATENT DOCUMENTS

| | | | |
|---|---|---|---|
| 3,688,196 | 8/1972 | Doelz | 375/39 |
| 4,606,051 | 8/1986 | Crabtree et al. | 375/86 |
| 4,648,100 | 3/1987 | Mardirosian | 375/86 |
| 4,656,630 | 4/1987 | Miyo | 370/95.3 |
| 4,696,027 | 9/1987 | Bonta | 455/33 |
| 4,747,114 | 5/1988 | Martinez | 375/98 |
| 4,764,732 | 8/1988 | Dion | 330/278 |
| 4,829,593 | 5/1989 | Hara | 455/234 |
| 4,912,705 | 3/1990 | Paneth et al. | 370/95.1 |
| 5,005,186 | 4/1991 | Aono et al. | 375/82 |
| 5,012,491 | 4/1991 | Iwasaki | 375/98 |
| 5,029,162 | 7/1991 | Epps | 375/98 |
| 5,083,304 | 1/1992 | Cahill | 455/239.1 |

Primary Examiner—Douglas W. Olms
Assistant Examiner—Min Jung
Attorney, Agent, or Firm—Richard A. Sonnentag; F. John Motsinger

[57] ABSTRACT

There is provided a method of digital Automatic Gain Control (AGC) in a receiver having limited dynamic range, particularly for discontinuous signals. The method comprises detecting the level of a received and AGC'd discontinuous signal, comparing the level of the AGC'd signal relative to the dynamic range of the receiver, and adjusting the AGC to establish a desired relationship between the AGC'd signal and the dynamic range limitation. There is also provided a method of handoff in a TDMA cellular-type transmission system utilizing this method of AGControl.

The method for Automatic Gain Control (AGC) of discontinuous signals in a receiver having limited dynamic range is further characterized by: digitizing a received and AGC'd discontinuous signal and converting the digitized samples to a power sample to sense the power of and detect the level of the signal, comparing the level of the AGC'd signal relative to the dynamic range of the receiver; and coarsely-adjusting by either progressively attenuating the signal until it falls within the dynamic range of the receiver or by progressively gain-amplifying the signal until it falls within the limited dynamic range of the receiver and finely-adjusting the AGC of the received signal until optimum use of the full (albeit limited) dynamic range of the signal processing stages is about 6-12 dB below maximum sensitivity to establish a desired relationship between the AGC'd signal and the dynamic range limitation.

25 Claims, 2 Drawing Sheets

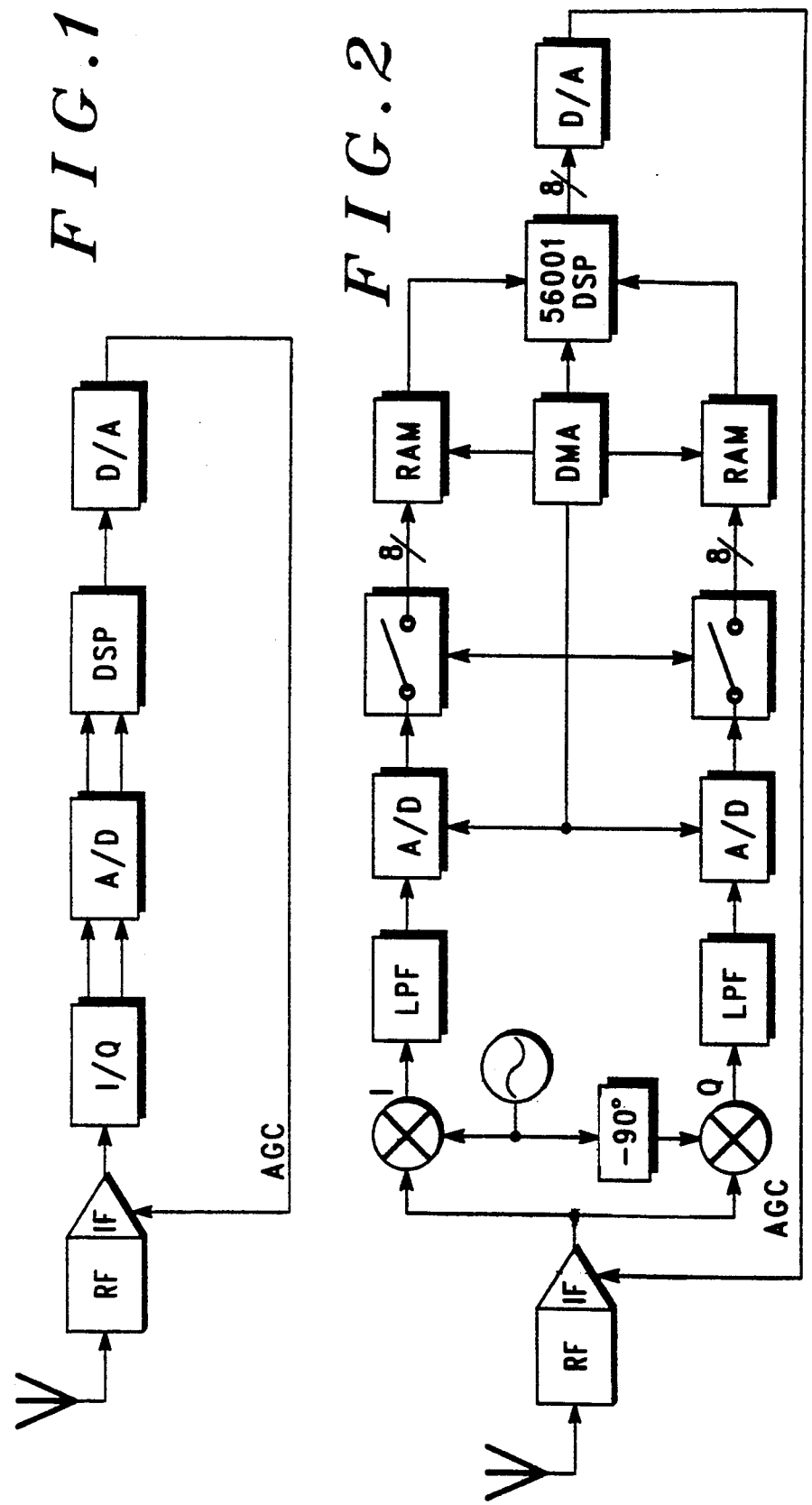

DIGITAL AUTOMATIC GAIN CONTROL

This is a continuation of application Ser. No. 07/652,381, filed Jan. 28, 1991 and now abandoned which is a continuation of application Ser. No. 07/278,051, filed Nov. 30, 1988 and now abandoned.

THE FIELD OF INVENTION

This invention is concerned with digital automatic gain control. More particularly, this invention is concerned with Automatic Gain Control (AGC) for discontinuous signals in a receiver having limited dynamic range.

BACKGROUND OF THE INVENTION

Although the concept of Automatic Gain Control (AGC) in radio signal reception is well understood, automatic gain control of Time Division multiplexed Multiple Access (TDMA) signals presents new challenges to the land-mobile industry.

In wideband TDMA systems, such as the cellular system proposed for use in Europe, an RF channel is shared (time-division-multiplexed) among numerous subscribers attempting to access the radio system in certain ones of various time-division-multiplexed time slots. The time slots are arranged into periodically repeating frames. Thus, a radio communication of interest may be periodically discontinuous—interleaved with unrelated signals transmitted in other time slots. The unrelated signals (of widely varying strength) must not influence the gain control of the signals of interest. A formidable challenge then is to provide Automatic Gain Control of these periodically discontinuous TDMA signals.

The challenge is further enhanced by attempting to provide digital AGC in inexpensive receivers—those having limited dynamic range. Since these signals may vary by as much as 100 dB in the land-mobile environment, but modest 8-bit Analog-to-Digital converters (A/D) for digital signal processing are limited to 48 dB dynamic range, techniques must be developed for controlling the gain of the signal to keep it within the limited dynamic range of the receiver. The challenge then is to handle a 100 dB discontinuous signal with a 48 dB device; otherwise, prohibitively expensive A/Ds with greater dynamic range must be utilized.

Another challenge for gain control is introduced by the digital nature of these TDMA transmission systems. Gaussian Minimum Shift Keying (GMSK) modulates the quadrature phases of the signal such that the power of the received signal is more difficult to measure, and neither of the quadrature phases, taken alone, is proportional to the received signal power.

This invention takes as its object to overcome these challenges and realize certain advantages, presented below.

SUMMARY OF THE INVENTION

In accordance with one embodiment of the invention, there is provided a method of digital Automatic Gain Control (AGC) in a receiver having limited dynamic range, particularly for discontinuous signals. The method comprises detecting the level of a received and AGC'd discontinuous signal, comparing the level of the AGC'd signal relative to the dynamic range of the receiver, and adjusting the AGC to establish a desired relationship between the AGC'd signal and the dynamic range limitation. There is also provided a method of handoff in a TDMA cellular-type transmission system utilizing this method of AGC control.

The method for Automatic Gain Control (AGC) of discontinuous signals in a receiver having limited dynamic range is further characterized by: digitizing a received and AGC'd discontinuous signal and converting the digitized samples to a power sample to sense the power of and detect the level of the signal, comparing the level of the AGC'd signal relative to the dynamic range of the receiver; and coarsely-adjusting by either progressively attenuating the signal until it falls within the dynamic range of the receiver or by progressively gain-amplifying the signal until it falls within the limited dynamic range of the receiver and finely-adjusting the AGC of the received signal until optimum use of the full (albeit limited) dynamic range of the signal processing stages is about 6–12 dB below the maximum to establish a desired relationship between the AGC'd signal and the dynamic range limitation.

BRIEF DESCRIPTION OF THE DRAWINGS

Additional objects, features, and advantages of the invention will be more clearly understood and the best mode contemplated for practicing it in its preferred embodiment will be appreciated (by way of unrestricted example) from the following detailed description, taken together with the accompanying drawings in which:

FIG. 1 is a simplified block diagram of the invention.

FIG. 2 is a functional block diagram of the preferred embodiment of the invention.

DETAILED DESCRIPTION

Figure 3:
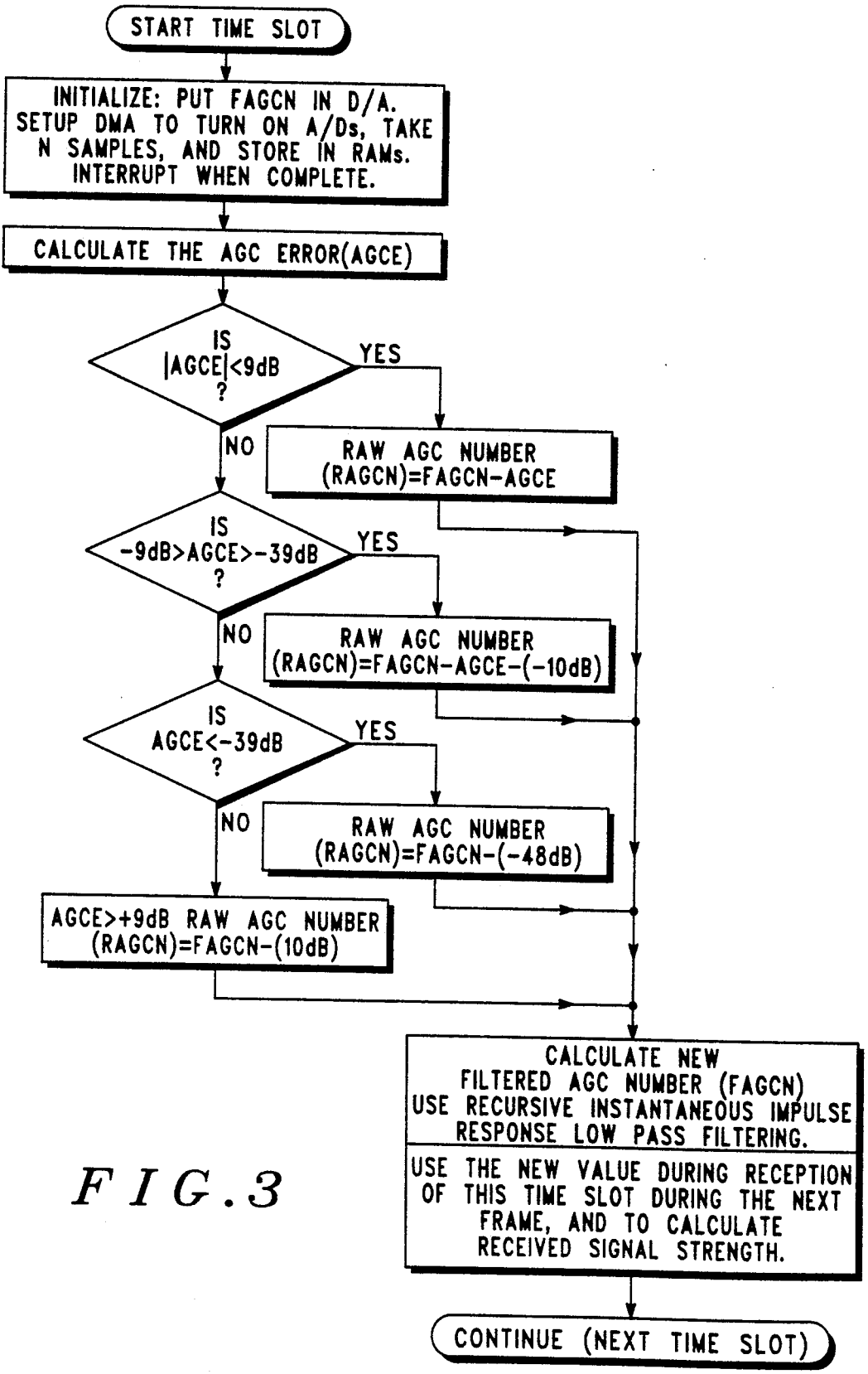
FIG. 3 is a diagram of the AGC control process according to the invention.

FIG. 1 is a simplified block diagram of the invention; it illustrates gain control in a digital quadrature receiver. It illustrates in series, an RF receiver section (IF), a quadrature demodulator (I/Q) having In-phase and Quadrature phases, Analog-to-Digital converters (A/D), a Digital Signal Processor (DSP), and a Digital-to-Analog converter (D/A) providing Automatic Gain Control (AGC) to the receiver section (RF/IF).

In operation, the signal is received, converted to an intermediate frequency and gain amplified in the receiver section (RF/IF); quadrature demodulated (I/Q) into In-phase and Quadrature components; digitized in Analog-to-Digital converters of limited dynamic range (A/D); and converted to a power sample in the Digital Signal Processors (DSP) to detect the level of the signal. In the Digital Signal Processors (DSP), the signal level is compared relative to the dynamic range of the receiver, and the AGC is adjusted in the Digital-to-Analog converter (D/A) to establish a desired relationship between the AGC'd signal and the dynamic range limitation of the receiver.

More concretely, the power level of the AGC'd signal is compared relative to a desired power level in the stage having the dynamic range limitation.

FIG. 2 is a functional block diagram of the preferred embodiment of the invention. FIG. 2 illustrates, in line, an RF receiver section (RF/IF); a quadrature demodulator (I/Q) having In-phase (I) and Quadrature (Q) phase mixers whose outputs are Low Pass Filtered (LPF); and, under Direct Memory Access control (DMA), 8-bit Analog-to-Digital converters (A/D), tri-state gates, Random Access Memories (RAM), and a 56001 Digital Signal Processor (56001 DSP); and a latching Digital-to-Analog converter (D/A) providing Automatic Gain Control (AGC) to the receiver section (RF/IF). This GMSK receiver is comprised of a conventional RF stage, mixing and filtering that feeds a 10.7 MHz IF signal to a conventional AGC-type IF amplifier (IF), such as a Motorola MC1350. The IF amplifier feeds a conventional I/Q demodulator comprised of a 10.7 MHz local oscillator, a 90 degree phase shifter, a pair of mixers and a pair of low pass filters (LPF). The 8-bit flash A/Ds, such as RCA CA3318CE's, provide 48 dB of dynamic range and are, in large part, responsible for the dynamic range limitation of the receiver. A Motorola 56001 Digital Signal Processor (56001 DSP) is used for signal acquisition, signal level detection, and AGC control. The 56001 DSP is supported by conventional clock and timing circuitry (not shown) and ROMs for programmed control (not shown). An Analog Devices 7528LN is suitable as the latching Digital-to-Analog converter (D/A) that provides Automatic Gain Control (AGC) to the receiver section (IF).

The receiver operates in a TDMA system having 8 time slots in each 4.8 millisecond frame; 135 kilobits/-second are transmitted in each quadrature phase. In operation, for each time slot, a retained previous AGC setting is fetched (DMA) from memory (RAM) through the Digital Signal Processor (56001 DSP) and applied to the Digital-to-Analog converter (D/A), providing Automatic Gain Control (AGC) to the receiver section (RF/IF). The received signal, after being gain-controlled and quadrature-demodulated is digitized by the Analog-to-Digital converters (A/D) to provide multiple pairs of samples per bit interval, which are stored in memory (RAM) under Direct Memory Access control (DMA) of the tri-state gates. The samples are retrieved from memory (RAM) and converted in the 56001 DSP to a power sample by summing N pairs (32 to 128 pairs in the preferred embodiment) to obtain a Q value and an I value, and taking the square root of the sum of the squares of the Q and I values. The square root is proportional to the average power of the received signal (an instantaneous power sample from a single pair cannot be reliably obtained due to the variability in the received signal strength). A preferred alternative measure for the power sample may be obtained by simply summing the squares of the Q and I values.

Again, more concretely, the power level of the AGC'd signal is compared relative to a desired power level in the stage having the dynamic range limitation. Thus, to prevent short-term saturation of the 8-bit Analog-to-Digital converters (A/D), the AGC wants to establish and maintain the level of the AGC'd signal at a nominal level of about 6–12 dB (9 dB in the preferred embodiment) below the maximum output of the A/D.

FIG. 3 is a diagram of the AGC control process according to the invention.

The basic control process is to:
- detect the level of a received and AGC'd discontinuous signal,
- compare the level of the AGC'd signal relative to the dynamic range of the receiver, and
- adjust the AGC to establish a desired relationship between the AGC'd signal and the dynamic range limitation.

The average power, as measured above, is then subtracted from a power level representative of the desired nominal level (or 9 dB, hereinafter given as 0 db reference) to calculate the power error. This calculated power error is further factored by an adjustment that compensates for the overall loop gain characteristics, resulting in an AGC Error (AGCE). If the AGC Error (AGCE) is within the margin below full output (9 dB), then the prevailing AGC setting (Filtered AGC Number-FAGCN) is finely-adjusted by the amount of the Error (AGCE). If the Error is greater than the margin (9 dB) but inside the dynamic range of the A/D (48 dB–9 dB=39 dB), then adjust by the amount of the Error (AGCE) plus slightly more than the margin (9 dB+1 dB=10 dB). If the Error falls below the dynamic range of the A/D, then coarsely-adjust by the amount of the dynamic range (48 dB); if the Error is above the dynamic range, then adjust by slightly more than the margin (9 dB+1 dB=10 dB). Finally, the current Error calculation and the previous gain setting (FAGCN) become the inputs to a digitally recursive infinite impulse response low pass filter (which is well understood by those ordinarily skilled in the art) to derive a new Filtered AGC Number (FAGCN). Thus, the signal is progressively gain-amplified (or gain-attenuated) until the signal falls within the dynamic range of the A/Ds and is further amplified (or attenuated) until optimum use (with appropriate margin) of the full (albeit limited) dynamic range of the A/Ds is obtained. The result of these various approximations for a plurality of TDM time slots may then be retained in memory (RAM) for resuming AGC control when the respective signals are expected to resume.

Furthermore, as these various gain calculation results are representative of the actually received signal strength (with appropriate compensation for overall loop gain characteristics), these gain determinations can be reported to the transmitting station for purposes of establishing transmission gain levels that optimally utilize the dynamic range of the receiver, thereby increasing spectral efficiency and frequency reuse in the system—particularly cellular systems. Moreover, in a cellular-type system, the signal strength (gain determination) may be reported to the transmitting station by the receiver and hand off the transmission when the AGC adjustment crosses a certain threshold. Also, the signal strength (AGC level) of an adjacent cell (time slot) can be determined and evaluated to facilitate hand-off.

In summary then, there has been provided a method of digital Automatic Gain Control (AGC) in a receiver having limited dynamic range, particularly for discontinuous signals. The method comprises detecting the level of a received and AGC'd discontinuous signal, comparing the level of the AGC'd signal relative to the dynamic range of the receiver, and adjusting the AGC to establish a desired relationship between the AGC'd signal and the dynamic range limitation. There has also been provided a method of handoff in a TDMA cellular-type transmission system utilizing this method of AGC control.

The method for Automatic Gain Control (AGC) of discontinuous signals in a receiver having limited dynamic range has further been characterized by: digitizing a received and AGC'd discontinuous signal and converting the digitized samples to a power sample to sense the power of and detect the level of the signal, comparing the level of the AGC'd signal relative to the dynamic range of the receiver; and coarsely-adjusting by either progressively attenuating the signal until it falls within the dynamic range of the receiver or by progressively gain-amplifying the signal until it falls within the limited dynamic range of the receiver and finely-adjusting the AGC of the received signal until optimum use of the full (albeit limited) dynamic range of the signal processing stages is about 6-12 dB below maximum sensitivity to establish a desired relationship between the AGC'd signal and the dynamic range limitation.

While the preferred embodiment of the invention has been described and shown, it will be appreciated by those skilled in the art that other variations and modifications of this invention may be implemented. For example, this invention need not be limited to TDMA land-mobile systems, but is adaptable to AGC of digital and analog signals.

This discussion presupposed that the A/Ds provide the most severe constraint on the dynamic range of the receiver; however, this invention is equally applicable without regard to the particular stage providing the most severe constraint on the dynamic range of the receiver. Accordingly, all discussion has been framed in terms of the limited dynamic range of the receiver.

These and all other variations and adaptations are expected to fall within the ambit of the appended claims.

What I claim and desire to secure by Letters Patent is:

1. A method of providing Automatic Gain Control in a receiver having a gain-controlled stage comprising:
    digitizing, in a digitizing means, a demodulated received signal in the receiver;
    determining a power level of said digitized received signal;
    calculating an error signal by comparing said determined level to a predetermined desired reference level;
    finely adjusting said gain in the receiver by an amount equal to said calculated error signal if said calculated error signal is within a predetermined margin about said predetermined desired reference level;
    coarsely increasing said gain in the receiver by an amount equal to said calculated error signal plus an amount greater than said predetermined margin if said calculated error signal is less than a lower limit of said predetermined margin but within a second predetermined range;
    coarsely increasing said gain in the receiver by an amount substantially equal to the sum of said predetermined margin and said predetermined range if said calculated error signal is less than a lower limit of said predetermined range;
    coarsely decreasing said gain in the receiver by an amount equal to said predetermined margin if said calculated error signal is greater than an upper limit of said predetermined margin;
    calculating an adjusted unfiltered receiver gain setting; and
    summing said adjusted unfiltered receiver gain setting with a plurality of previously calculated and stored unfiltered receiver gain settings in a digital low-pass filter to provide an updated filtered receiver gain setting.

2. A method as claimed in claim 1, wherein said predetermined margin extends from the maximum desired level at the digitizing means to a desired nominal level that is chosen to be 6 to 12 decibels below said maximum desired level, and to a substantially equal amount of decibels below said desired nominal level and wherein said predetermined range extends from the lower limit of said predetermined margin to the lowest desired level within the dynamic range of said digitizing means.

3. A method as claimed in claim 2 wherein said predetermined margin is substantially plus or minus 6 to 12 decibels about said predetermined desired reference level.

4. A method as claimed in claim 1 wherein an indication related to said updated filtered receiver gain setting is reported by the receiver to the transmitting station to establish transmission levels that efficaciously utilize the receiver's dynamic range.

5. A method as claimed in claim 1 wherein an indication related to said updated filtered receiver gain setting is reported by the receiver to the transmitting station to facilitate handoff determinations in a cellular-type system.

6. A method as claimed in claim 5 further comprising handling off transmissions in a cellular-type system when such indication passes a certain threshold.

7. A method as claimed in claim 1 wherein an indication related to said updated filtered receiver gain setting of an alternate channel in a cellular-type system is evaluated to facilitate handoff determinations.

8. A method as claimed in claim 1 wherein signals comprise discontinuous signals in time slots of TDM communications.

9. A method of providing Automatic Gain Control in a receiver having a gain-controlled stage comprising:
    digitizing a demodulated received signal in the receiver;
    determining a power level of said digitized received signal;
    calculating an error signal by comparing said determined level to a predetermined desired reference level;
    finely adjusting said gain in the receiver prior to demodulation by an amount equal to said calculated error signal if said calculated error signal is within a predetermined margin about said predetermined desired reference level;
    coarsely increasing said gain in the receiver prior to demodulation by an amount equal to said calculated error signal plus an amount greater than said predetermined margin if said calculated error signal is less than a lower limit of said predetermined margin but within a second predetermined range;
    coarsely increasing said gain in the receiver prior to demodulation by an amount substantially equal to the sum of said predetermined margin and said predetermined range if said calculated error signal is less than a lower limit of said predetermined range;
    coarsely decreasing said gain in the receiver prior to demodulation by an amount equal to said predetermined margin if said calculated error signal is greater than an upper limit of said predetermined margin;
    calculating an adjusted unfiltered receiver gain setting; and
    summing said adjusted unfiltered receiver gain setting with a plurality of previously calculated and stored unfiltered receiver gain settings in a digital low-pass filter to provide an updated filtered receiver gain setting.

10. A method of providing Automatic Gain Control in a quadrature-modulated receiver having a gain-controlled stage comprising:

digitizing a demodulated received signal in the receiver;

determining a power level of said digitized quadrature-modulated received signal;

calculating an error signal by comparing said determined level to a predetermined desired reference level;

finely adjusting said gain in the receiver by an amount equal to said calculated error signal if said calculated error signal is within a predetermined margin about said predetermined desired reference level;

coarsely increasing said gain in the receiver by an amount equal to said calculated error signal plus an amount greater than said predetermined margin if said calculated error signal is less than a lower limit of said predetermined margin but within a second predetermined range;

coarsely increasing said gain in the receiver by an amount substantially equal to the sum of said predetermined margin and said predetermined range if said calculated error signal is less than a lower limit of said predetermined range;

coarsely decreasing said gain in the receiver by an amount equal to said predetermined margin if said calculated error signal is greater than an upper limit of said predetermined margin;

calculating an adjusted unfiltered receiver gain setting; and summing said adjusted unfiltered receiver gain setting with a plurality of previously calculated and stored unfiltered receiver gain settings in a digital low-pass filter to provide an updated filtered receiver gain setting.

11. The method of claim 10 wherein said quadrature modulated signals further comprise gaussian minimum-shift keying (GMSK) modulated signals.

12. The method of claim 10 wherein said quadrature modulated signals further comprise differential quaternary phase-shift keying (DQPSK) modulated signals.

13. The method of claim 10 wherein said-quadrature modulated signals further comprise $\pi/4$ quaternary phase-shift keying ($\pi/4$ QPSK) modulated signals.

14. A method of providing Automatic Gain Control in a receiver having a gain-controlled stage, said receiver receiving discontinuous signals, the method comprising the steps of:

digitizing one predetermined time slot of a demodulated received signal;

determining a power level of said digitized received signal;

calculating an error signal by comparing said determined level to a predetermined desired reference level;

finely adjusting said gain in the receiver within a specified predetermined time period and prior to receiving the next predetermined time slot by an amount equal to said calculated error signal if said calculated error signal is within a predetermined margin about said predetermined desired reference level;

coarsely increasing said gain in the receiver within a specified predetermined time period and prior to receiving the next predetermined time slot by an amount equal to said calculated error signal plus an amount greater than said predetermined margin if said calculated error signal is less than a lower limit of said predetermined margin but within a second predetermined range;

coarsely increasing said gain in the receiver within a specified predetermined time period and prior to receiving the next predetermined time slot by an amount substantially equal to the sum of said predetermined margin and said predetermined range if said calculated error signal is less than a lower limit of said predetermined range;

coarsely decreasing said gain in the receiver within a specified predetermined time period and prior to receiving the next predetermined time slot by an amount equal to said predetermined margin if said calculated error signal is greater than an upper limit of said predetermined margin;

calculating an adjusted unfiltered receiver gain setting within said specified predetermined time period and prior to receiving the next predetermined time slot;

summing said adjusted unfiltered receiver gain setting with a plurality of previously calculated and stored unfiltered receiver gain settings in a digital low-pass filter to provide an updated filtered receiver gain setting within said specified predetermined time period and prior to receiving the next predetermined time slot; and readjusting said receiver gain with said updated filtered receiver gain setting within said specified predetermined time period and prior to receiving the next predetermined time slot.

15. A method of providing Automatic Gain Control in a quadrature-modulated receiver having a gain-controlled stage, said receiver receiving discontinuous signals, the method comprising the steps of:

digitizing one predetermined time slot of a quadrature-modulated received signal;

determining a power level of the digitized quadrature-modulated received signal;

calculating an error signal by comparing said determined level to a predetermined desired reference level;

finely adjusting said gain in the receiver within a specified predetermined time period and prior to receiving the next predetermined time slot by an amount equal to said calculated error signal if said calculated error signal is within a predetermined margin about said predetermined desired reference level;

coarsely increasing said gain in the receiver within a specified predetermined time period and prior to receiving the next predetermined time slot by an amount equal to said calculated error signal plus an amount greater than said predetermined margin if said calculated error signal is less than a lower limit of said predetermined margin but within a second predetermined range;

coarsely increasing said gain in the receiver within a specified predetermined time period and prior to receiving the next predetermined time slot by an amount substantially equal to the sum of said predetermined margin and said predetermined range if said calculated error signal is less than a lower limit of said predetermined range;

coarsely decreasing said gain in the receiver within a specified predetermined time period and prior to receiving the next predetermined time slot by an amount equal to said predetermined margin if said calculated error signal is greater than an upper limit of said predetermined margin;

calculating an adjusted unfiltered receiver gain setting within said specified predetermined time period and prior to receiving the next predetermined time slot;

summing said adjusted unfiltered receiver gain setting with a plurality of previously calculated and stored unfiltered receiver gain setting in a digital low-pass filter to provide an updated filtered receiver gain setting within said specified predetermined time period and prior to receiving the next predetermined time slot; and readjusting said receiver gain with said updated filtered receiver gain setting within said specified predetermined time period and prior to receiving the next predetermined time slot.

16. An apparatus for providing Automatic Gain Control in a receiver having a gain-controlled stage, the apparatus comprising:

means for digitizing a demodulated received signal in the receiver;

means for determining a power level of said digitized received signal;

means for calculating an error signal by comparing said determined level to a predetermined desired reference level;

means for finely adjusting said gain in the receiver by an amount equal to said calculated error signal if said calculated error signal is within a predetermined margin about said predetermined desired reference level, coarsely increasing said gain in the receiver by an amount equal to said calculated error signal plus an amount greater than said predetermined margin if said calculated error signal is less than a lower limit of said predetermined margin but within a second predetermined range, coarsely increasing said gain in the receiver by an amount substantially equal to the sum of said predetermined margin and said predetermined range if said calculated error signal is less than a lower limit of said predetermined range, coarsely decreasing said gain in the receiver by an amount equal to said predetermined margin if said calculated error signal is greater than an upper limit of said predetermined margin;

means for calculating an adjusted unfiltered receiver gain setting; and means for summing said adjusted unfiltered receiver gain setting with a plurality of previously calculated and stored unfiltered receiver gain settings in a digital low-pass filter to provide an updated filtered receiver gain setting.

17. An apparatus as claimed in claim 16, wherein said predetermined margin extends from the maximum desired level at said means for digitizing to a desired nominal level that is chosen to be 6 to 12 decibels below said maximum desired level, and to a substantially equal amount of decibels below said desired nominal level and wherein said predetermined range extends from the lower limit of said predetermined margin to the lowest desired level within the dynamic range of said means for digitizing.

18. An apparatus as claimed in claim 17 wherein said predetermined margin is substantially plus or minus 6 to 12 decibels about said predetermined desired reference level.

19. An apparatus for providing Automatic Gain Control in a receiver having a gain-controlled stage, the apparatus comprising:

means for digitizing a demodulated received signal in the receiver;

means for determining a power level of said digitized received signal;

means for calculating an error signal by comparing said determined level to a predetermined desired reference level;

means for finely adjusting said gain in the receiver prior to demodulation by an amount equal to said calculated error signal if said calculated error signal is within a predetermined margin about said predetermined desired reference level, coarsely increasing said gain in the receiver prior to demodulation by an amount equal to said calculated error signal plus an amount greater than said predetermined margin if said calculated error signal is less than a lower limit of said predetermined margin but within a second predetermined range, coarsely increasing said gain in the receiver prior to demodulation by an amount substantially equal to the sum of said predetermined margin and said predetermined range if said calculated error signal is less than a lower limit of said predetermined range, coarsely decreasing said gain in the receiver prior to demodulation by an amount equal to said predetermined margin if said calculated error signal is greater than an upper limit of said predetermined margin;

means for calculating an adjusted unfiltered receiver gain setting; and means for summing said adjusted unfiltered receiver gain setting with a plurality of previously calculated and stored unfiltered receiver gain settings in a digital low-pass filter to provide an updated filtered receiver gain setting.

20. An apparatus for providing Automatic Gain Control in a quadrature-modulated receiver having a gain-controlled stage comprising:

digitizing a demodulated received signal in the receiver;

means for determining a power level of said quadrature modulated received signal;

means for calculating an error signal by comparing said determined level to a predetermined desired reference level;

means for finely adjusting said gain in the receiver by an amount equal to said calculated error signal if said calculated error signal is within a predetermined margin about said predetermined desired reference level, coarsely increasing said gain in the receiver by an amount equal to said calculated error signal plus an amount greater than said predetermined margin if said calculated error signal is less than a lower limit of said predetermined margin but within a second predetermined range, coarsely increasing said gain in the receiver by an amount substantially equal to the sum of said predetermined margin and said predetermined range if said calculated error signal is less than a lower limit of said predetermined range, coarsely decreasing said gain in the receiver by an amount equal to said predetermined margin if said calculated error signal is greater than an upper limit of said predetermined margin;

means for calculating an adjusted unfiltered receiver gain setting; and means for summing said adjusted unfiltered receiver gain setting with a plurality of previously calculated and stored unfiltered receiver gain settings in a digital low-pass filter to provide an updated filtered receiver gain setting.

21. An apparatus for providing Automatic Gain Control in a receiver having a gain-controlled stage, said receiver receiving discontinuous signals, the apparatus comprising:

means for digitizing one predetermined time slot of a received signal;

means for determining a power level of said digitized received signal;

means for calculating an error signal by comparing said determined level to a predetermined desired reference level;

means for finely adjusting said gain in the receiver within a specified predetermined time period and prior to receiving the next predetermined time slot by an amount equal to said calculated error signal if said calculated error signal is within a predetermined margin about said predetermined desired reference level; coarsely increasing said gain in the receiver within a specified predetermined time period and prior to receiving the next predetermined time slot by an amount equal to said calculated error signal plus an amount greater than said predetermined margin if said calculated error signal is less than a lower limit of said predetermined margin but within a second predetermined range; coarsely increasing said gain in the receiver within a specified predetermined time period and prior to receiving the next predetermined time slot by an amount substantially equal to the sum of said predetermined margin and said predetermined range if said calculated error signal is less than a lower limit of said predetermined range; coarsely decreasing said gain in the receiver within a specified predetermined time period and prior to receiving the next predetermined time slot by an amount equal to said predetermined margin if said calculated error signal is greater than an upper limit of said predetermined margin;

means for calculating an adjusted unfiltered receiver gain setting within said specified predetermined time period and prior to receiving the next predetermined time slot;

means for summing said adjusted unfiltered receiver gain setting with a plurality of previously calculated and stored unfiltered receiver gain settings in a digital low-pass filter to provide an updated filtered receiver gain setting within said specified predetermined time period and prior to receiving the next predetermined time slot; and means for readjusting said receiver gain with said updated filtered receiver gain setting within said specified predetermined time period and prior to receiving the next predetermined time slot.

22. An apparatus for providing Automatic Gain Control in a quadrature-modulated receiver having a gain-controlled stage, said receiver receiving discontinous signals, the apparatus comprising:

means for digitizing one predetermined time slot of a quadrature-modulated received signal;

means for determining a power level of the digitized quadrature-modulated received signal;

means for calculating an error signal by comparing said determined level to a predetermined desired reference level;

means for finely adjusting said gain in the receiver within a specified predetermined time period and prior to receiving the next predetermined time slot by an amount equal to said calculated error signal if said calculated error signal is within a predetermined margin about said predetermined desired reference level; coarsely increasing said gain in the receiver within a specified predetermined time period and prior to receiving the next predetermined time slot by an amount equal to said calculated error signal plus an amount greater than said predetermined margin if said calculated error signal is less than a lower limit of said predetermined margin but within a second predetermined range; coarsely increasing said gain in the receiver within a specified predetermined time period and prior to receiving the next predetermined time slot by an amount substantially equal to the sum of said predetermined margin and said predetermined range if said calculated error signal is less than a lower limit of said predetermined range; coarsely decreasing said gain in the receiver within a specified predetermined time period and prior to receiving the next predetermined time slot by an amount equal to said predetermined margin if said calculated error signal is greater than an upper limit of said predetermined margin;

means for calculating an adjusted unfiltered receiver gain setting within said specified predetermined time period and prior to receiving the next predetermined time slot;

means for summing said adjusted unfiltered receiver gain setting with a plurality of previously calculated and stored unfiltered receiver gain settings in a digital low-pass filter to provide an updated filtered receiver gain setting within said specified predetermined time period and prior to receiving the next predetermined time slot; and means for readjusting said receiver gain with said updated filtered receiver gain setting within said specified predetermined time period and prior to receiving the next predetermined time slot.

23. A method of providing Automatic Gain Control in a GMSK-modulated receiver having a gain-controlled stage comprising:

digitizing a demodulated received signal in the receiver;

determining a power level of said GMSK-modulated received signal;

calculating an error signal by comparing said determined level to a predetermined desired reference level;

finely adjusting said gain in the receiver by an amount equal to said calculated error signal if said calculated error signal is within a predetermined margin about said predetermined desired reference level;

coarsely increasing said gain in the receiver by an amount equal to said calculated error signal plus an amount greater than said predetermined margin if said calculated error signal is less than a lower limit of said predetermined margin but within a second predetermined range;

coarsely increasing said gain in the receiver by an amount substantially equal to the sum of said predetermined margin and said predetermined range if said calculated error signal is less than a lower limit of said predetermined range;

coarsely decreasing said gain in the receiver by an amount equal to said predetermined margin if said calculated error signal is greater than an upper limit of said predetermined margin;

calculating an adjusted unfiltered receiver gain setting; and summing said adjusted unfiltered receiver gain setting with a plurality of previously calculated and stored unfiltered receiver gain settings in a digital low-pass filter to provide an updated filtered receiver gain setting.

24. A method of providing Automatic Gain Control in a DQPSK-modulated receiver having a gain-controlled stage comprising:

digitizing a demodulated received signal in the receiver;

determining a power level of said DQPSK-modulated received signal;

calculating an error signal by comparing said determined level to a predetermined desired reference level;

finely adjusting said gain in the receiver by an amount equal to said calculated error signal if said calculated error signal is within a predetermined margin about said predetermined desired reference level;

coarsely increasing said gain in the receiver by an amount equal to said calculated error signal plus an amount greater than said predetermined margin if said calculated error signal is less than a lower limit of said predetermined margin but within a second predetermined range;

coarsely increasing said gain in the receiver by an amount substantially equal to the sum of said predetermined margin and said predetermined range if said calculated error signal is less than a lower limit of said predetermined range;

coarsely decreasing said gain in the receiver by an amount equal to said predetermined margin if said calculated error signal is greater than an upper limit of said predetermined margin;

calculating an adjusted unfiltered receiver gain setting; and summing said adjusted unfiltered receiver gain setting with a plurality of previously calculated and stored unfiltered receiver gain settings in a digital low-pass filter to provide an updated filtered receiver gain setting.

25. A method of providing Automatic Gain Control in a $\pi/4$ QPSK-modulated receiver having a gain-controlled stage comprising:

digitizing a demodulated received signal in the receiver;

determining a power level of said $\pi/4$ QPSK-modulated received signal;

calculating an error signal by comparing said determined level to a predetermined desired reference level;

finely adjusting said gain in the receiver by an amount equal to said calculated error signal if said calculated error signal is within a predetermined margin about said predetermined desired reference level;

coarsely increasing said gain in the receiver by an amount equal to said calculated error signal plus an amount greater than said predetermined margin if said calculated error signal is less than a lower limit of said predetermined margin but within a second predetermined range;

coarsely increasing said gain in the receiver by an amount substantially equal to the sum of said predetermined margin and said predetermined range if said calculated error signal is less than a lower limit of said predetermined range;

coarsely decreasing said gain in the receiver by an amount equal to said predetermined margin if said calculated error signal is greater than an upper limit of said predetermined margin;

calculating an adjusted unfiltered receiver gain setting; and summing said adjusted unfiltered receiver gain setting with a plurality of previously calculated and stored unfiltered receiver gain settings in a digital low-pass filter to provide an updated filtered receiver gain setting.

* * * * *